United States Patent
Ozturk (10) Patent No.: US 11,018,018 B2
(45) Date of Patent: May 25, 2021

(54) SUPERSTRATE AND METHODS OF USING THE SAME

(71) Applicant: CANON KABUSHIKI KAISHA, Tokyo (JP)

(72) Inventor: Ozkan Ozturk, Round Rock, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 282 days.

(21) Appl. No.: 16/210,625

(22) Filed: Dec. 5, 2018

(65) Prior Publication Data

US 2020/0185230 A1   Jun. 11, 2020

(51) Int. Cl.
| | |
|---|---|
| H01L 21/3105 | (2006.01) |
| G03F 7/00 | (2006.01) |
| B29C 43/02 | (2006.01) |
| B29C 43/00 | (2006.01) |
| B81C 1/00 | (2006.01) |
| B29C 35/02 | (2006.01) |

(52) U.S. Cl.
CPC ........ *H01L 21/31051* (2013.01); *B29C 35/02* (2013.01); *B29C 43/003* (2013.01); *B29C 43/021* (2013.01); *B81C 1/00611* (2013.01); *G03F 7/0002* (2013.01); *B29C 2043/025* (2013.01); *B81C 2201/0119* (2013.01)

(58) Field of Classification Search
CPC ......... H01L 21/31051; H01L 21/31058; G03F 7/0002; B29C 3/021; B29C 13/003; B29C 35/02; B29C 2043/025; B81C 1/00611; B81C 2201/0119
See application file for complete search history.

(56) References Cited

U.S. PATENT DOCUMENTS

| | | | |
|---|---|---|---|
| 5,679,610 A | * 10/1997 | Matsuda | ........... H01L 21/31051 257/E21.243 |
| 6,218,316 B1 | 4/2001 | Marsh | |
| 6,696,220 B2 | 2/2004 | Bailey et al. | |
| 6,716,767 B2 | 4/2004 | Shih et al. | |
| 7,790,231 B2 | 9/2010 | McCutcheon et al. | |
| 8,741,199 B2 | 6/2014 | Lan et al. | |
| 2010/0308008 A1 | * 12/2010 | Zhu | ........................ B29C 59/026 216/11 |
| 2015/0077832 A1 | * 3/2015 | Berland | .................. G02F 1/161 359/275 |

* cited by examiner

*Primary Examiner* — Yasser A Abdelaziez
(74) *Attorney, Agent, or Firm* — Abel Schillinger, LLP (57) ABSTRACT

An apparatus may include a superstrate. The superstrate can include a body having a diameter. The body may fit within a projected square. The projected square may have a length equal to the diameter of the body. The body within the projected square may produce an open area between an exterior edge of the body and the projected square. The superstrate may further include a first projection extending from the exterior edge of the body within the open area.

20 Claims, 6 Drawing Sheets

FIG. 6

SUPERSTRATE AND METHODS OF USING THE SAME

FIELD OF THE DISCLOSURE

The present disclosure relates to substrate processing, and more particularly to planarization of surfaces in semiconductor fabrication.

RELATED ART

Planarization techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer.

However, defects can arise as the superstrate separates from the dispense material on the substrate. Improvements in planarization techniques are desired to allow for whole wafer processing.

SUMMARY

In an aspect, a superstrate can include a body having a diameter. The body may fit within a projected square. The projected square may have a length equal to the diameter of the body. The body within the projected square may produce an open area between an exterior edge of the body and the projected square. The superstrate may further include a first projection extending from the exterior edge of the body within the open area.

In another aspect, the first projection may have a length Y less than or equal to $r\sqrt{2}-r$, where r is a radius of the body.

In yet another aspect, the first projection may be a geometric shape.

In another aspect, the open area may be equal to the area of the projected square minus the area of the body.

In a further aspect, the first projection may occupy less than or equal to $\frac{1}{4}^{th}$ the open area.

In another aspect, the superstrate may further comprise a second projection, wherein the second projection may be within $\frac{1}{4}^{th}$ the open area not occupied by the first projection.

In another aspect, the second projection may have a length z less than or equal to $r\sqrt{2}-r$, where r is the radius of the body.

In yet another aspect, the superstrate may further comprise a third projection, wherein the third projection may be within $\frac{1}{4}^{th}$ the open area not occupied by either the first projection or second projection and a fourth projection, wherein the fourth projection may be within $\frac{1}{4}^{th}$ the open area not occupied by any of the first projection, second projection, or third projection.

In another aspect, the third projection may have a length x less than or equal to $r\sqrt{2}-r$ where r is the radius of the body.

In a further aspect, the length Y of the first projection may be greater than zero.

In another aspect, the fourth projection has a length w less than or equal to $r\sqrt{2}-r$, where r is the radius of the body.

In another aspect, the first projection is opposite the second projection.

In another aspect, a method of forming a planarization layer may include depositing a formable material on a substrate, and aligning a superstrate with the substrate. The superstrate may include a body having a diameter. The body may fit within a projected square. The projected square may have a length equal to the diameter of the body. The body within the projected square may produce an open area between an exterior edge of the body and the projected square. A first projection may extend from the exterior edge of the body within the open area. The method may further include contacting the mesa with the substrate and separating the superstrate and the substrate.

In another aspect, separating the superstrate and the substrate may be by applying a force on the first projection to enhance a crack propagation between the mesa and the substrate.

In yet another aspect, the open area may be equal to the area of the projected square minus the area of the body.

In a further aspect, the first projection may have a length y greater than zero.

In another aspect, the first projection may have multiple waves or curves.

In a further aspect, the first projection may be a semicircle.

In yet another aspect, the first projection may have an area less than $\frac{1}{4}^{th}$ the open area.

In another aspect a method of manufacturing an article can include depositing a formable material on a substrate and aligning a superstrate with the substrate. The superstrate may include a body having a diameter. The body may fit within a projected square. The projected square may have a length equal to the diameter of the body. The body within the projected square may produce an open area between an exterior edge of the body and the projected square. A first projection may extend from the exterior edge of the body within the open area. The method of manufacturing an article can further include contacting the mesa with the substrate, curing the formable material to form a planar layer, separating the superstrate and the substrate, processing the substrate on which the planar layer has been formed, and manufacturing the article from the processed substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Figure 1:
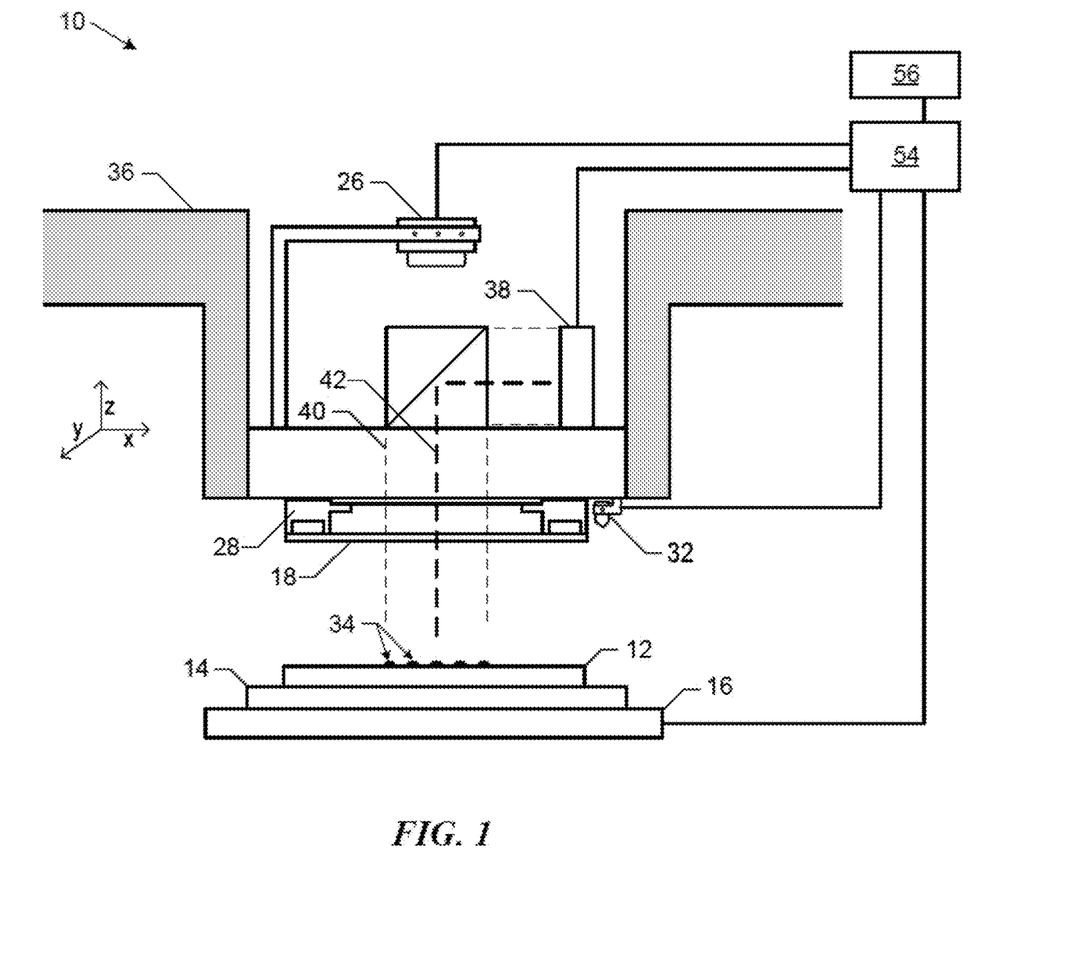
FIG. 1 includes an illustration of a side view of an exemplary lithography system.

Referring to FIG. 1, an apparatus 10 in accordance with an embodiment described herein can be used in controlling the environment over a substrate 12 in preparation for planarization. The substrate 12 may be a semiconductor base material, such as a silicon wafer, but may include an insulating base material, such as glass, sapphire, spinel, or the like. The substrate 12 may be coupled to a substrate holder 14. The substrate holder 14 may be a vacuum chuck; however, in other embodiments the substrate holder 14 may be any chuck including vacuum, pin-type, groove-type, electrostatic, electromagnetic, or the like. The substrate 12 and substrate holder 14 may be further supported by a stage 16. The stage 16 may provide translating or rotational motion along the X-, Y-, or Z-directions. The stage 16, substrate 12, and substrate holder 14 may also be positioned on a base (not illustrated).

Spaced-apart from the substrate 12 may be a superstrate 18. The superstrate 18 can include a body having a first side and a second side with one side having a mold extending therefrom towards the substrate 12. The mold may be sometimes referred to as a mesa. In an embodiment, the superstrate 18 can be formed without a mold, as seen in FIG. 1. The superstrate 18, mold, or both may be formed from such materials including a glass-based material, silicon, a spinel, fused-silica, quartz, silicon, organic polymers, siloxane polymers, fluorocarbon polymers, metal, hardened sapphire, other similar materials, or any combination thereof. The glass-based material can include soda lime glass, borosilicate glass, alkali-barium silicate glass, aluminosilicate glass, quartz, synthetic fused-silica, or the like. The superstrate 18 can include a deposited oxide, anodized alumina, an organo-silane, an organosilicate material, an organic polymer, inorganic polymers, and any combination thereof. The body of the superstrate 18 can have a thickness in a range of 30 microns to 2000 microns.

The superstrate 18 and mold can include a single piece construction. Alternatively, the superstrate 18 and mold can include separate components coupled together. In one embodiment, an imprint surface of the mold can include a planar surface. In another embodiment, the imprint surface can include features defined by spaced-apart recesses and protrusions. The imprint surface may define any original pattern that forms the basis of a pattern to be formed on the substrate 12. In another embodiment, the imprint surface can be a blank, that is, the imprint surface does not have any recesses or projections and can have a planar contact surface.

Among other things, the superstrate 18 can be used to planarize a formable material on a substrate 12. The superstrate 18 can be coupled to a superstrate holder 28. The superstrate 18 may be both held by and its shape modulated by the superstrate holder 28. The superstrate holder 28 may be configured to hold a superstrate 18 within a chucking region. The superstrate holder 28 can be configured as vacuum, pin-type, groove-type, electrostatic, electromagnetic, or another similar holder type. In one embodiment, the superstrate holder 28 can be used to modulate the shape of superstrate 18 by applying pressure, either positive or vacuum, to various zones of holder 28 in order to modulate the shape of the superstrate 18. In one embodiment, the superstrate holder 28 can include a transparent window within the body of the superstrate holder 28. In an embodiment, the superstrate holder 28 may be coupled to an imprint head 26 such that the superstrate holder 28 or imprint head 26 can facilitate translation or rotational motion of the superstrate 18 along the X-, Y-, or Z-directions. In one embodiment, the superstrate 18 can have a surface area that is about the same as the substrate 12. In one embodiment, the substrate 12 and superstrate 18 may have a 300 mm diameter. In one embodiment, the substrate 12 and superstrate 18 may have a diameter between 300 mm and 600 mm. In one embodiment, the substrate 12 and superstrate 18 may have a diameter between 300 mm and 450 mm. In another embodiment, the substrate 12 and superstrate 18 may have a diameter between 450 mm and 600 mm.

The apparatus 10 can further include a fluid dispense system 32 used to deposit a formable material 34 on the surface of the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold and the substrate 12. For example, the formable material 34 can include a monomer mixture that can be cured using ultraviolet light, heat, or the like.

The lithographic system 10 can further include an energy source 38 coupled to a direct energy 40 along a path 42. The imprint head 26 and stage 16 can be configured to position the superstrate 18 and substrate 12 in superimposition with the path 42. The lithographic system 10 can be regulated by a logic element 54 in communication with the stage 16, imprint head 26, fluid dispense system 32, or energy source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2A:
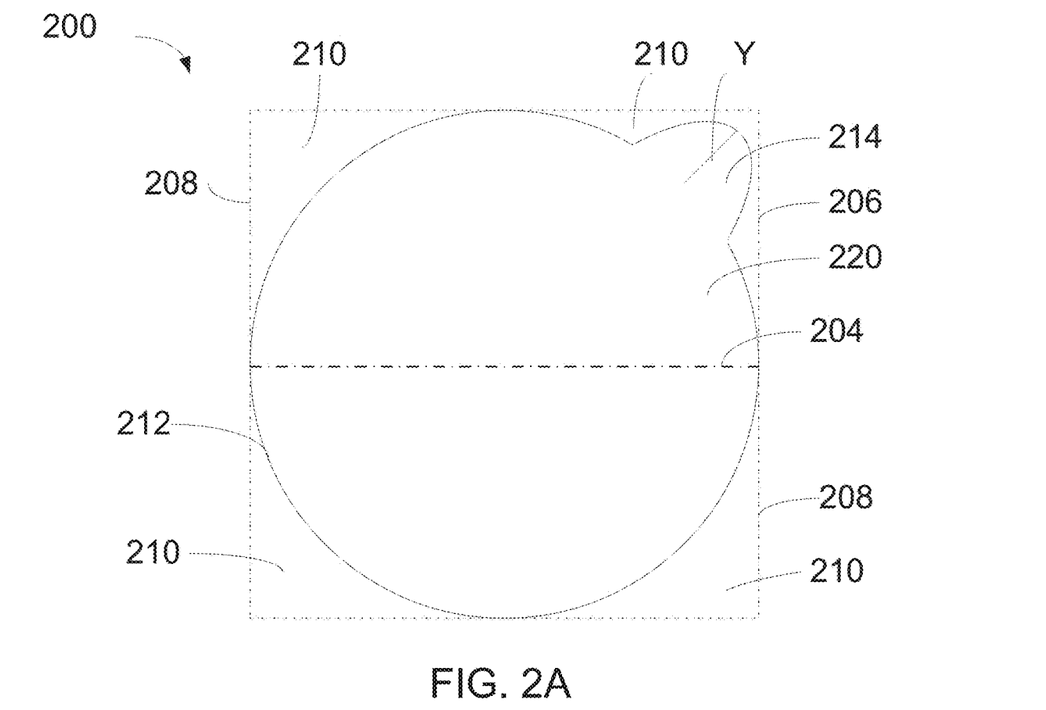
FIG. 2A includes an illustration of a top view of a device superstrate in accordance with an embodiment described herein.

FIG. 2A includes an illustration of a top view of a device superstrate 200 in accordance with an embodiment described herein. The superstrate 200 can be similar to the superstrate 18 of FIG. 1. The superstrate 200 can include a body 220 with a projection 214. In one embodiment the superstrate 200 can fit within a projected square 206. The projected square 206 can have a length 208 of each side equal to a diameter 204 of the body 220. In another embodiment, the superstrate 200 can fit within a projected rectangle. The superstrate 200 within the projected square 206 can produce an area 210 between an exterior edge 212 of the body 220 and the projected square 206. In one embodiment, where the body 220 of the superstrate 200 is circular, the body 220 can have an area equal to the area of $\pi r^2$ where r is the radius of the superstrate 200. The open area 210 may be towards the outer edge of the projected square 206. The open area 210 may be at the four corners of the projected square 206. In one embodiment, the open area 210 is about the area of the projected square 206 minus the area of the superstrate 200.

Figure 2B:
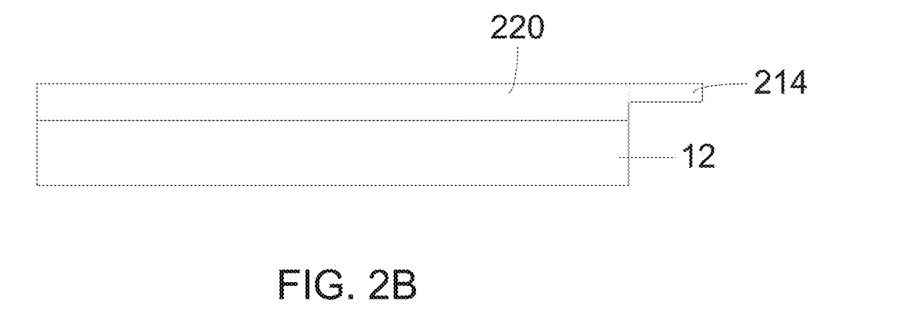
FIG. 2B includes an illustration of a side view of the substrate and the superstrate in accordance with the embodiment of FIG. 2A.

The projection 214 may extend from the body 220 into the open area 210. In one embodiment, the projection 214 may extend from the exterior edge 212 into one-fourth of the open area 210. In one embodiment, the projection 214 and the body 220 are one continuous piece. In another embodiment, the projection 214 and the body 220 are separate pieces. The projection 214 can have a length Y greater than zero and less than or equal to $r\sqrt{2}-r$, where r is a radius of the body 220. In one embodiment, the length Y can be greater than zero. In another embodiment, the length of Y can be greater than 50 microns. As can be seen in FIG. 2B, the projection 214 may extend beyond the exterior edge 212 of the body 220. In one embodiment, the projection 214 provides an area in which the superstrate 200 can be leveraged to begin separation from the substrate 12. In one embodiment the projection 214 can extend beyond an outer edge of the substrate 12. In one embodiment, the projection 214 has a thickness about equal to a thickness of the body 220. In another embodiment, the projection 214 has a thickness that is less that the thickness of the body 220. In one embodiment, the projection 214 can have an oval shape. In another embodiment, the projection 214 can have sharp edges. In another embodiment, the projection 214 can have a rectangular shape. In another embodiment, the projection 214 can be a geometric shape. In yet another embodiment, the projection 214 can have a wave shape with two peaks projecting into the open are 210. In another embodiment, the projection 214 can encompass one fourth the open area 210. While only one projection is shown, more projections are possible, as will be described in more detail below. In one embodiment, the body 220 can include at least one projection and no more than four projections.

Figure 3:
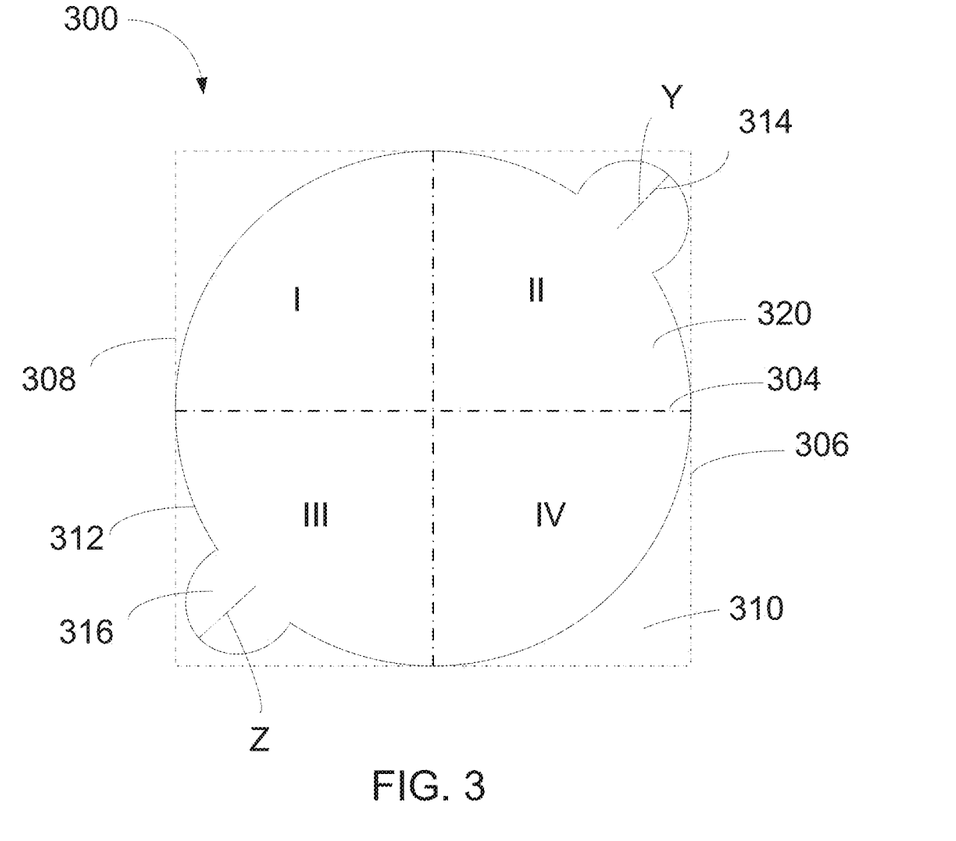
FIG. 3 includes an illustration of a top view of a device superstrate in accordance with an embodiment described herein.

FIG. 3 includes an illustration of a top view of a device superstrate 300 in accordance with an embodiment described herein. The superstrate 300 can be similar to the superstrate 18 of FIG. 1. The superstrate 300 can include a body 320 with a first projection 314 and a second projection 316. The superstrate 300 can fit within a projected square 306 having sides 308. In one embodiment, a length of each side 308 of the projected square 306 can be equal to a diameter 304 of the body 320 of the superstrate 300. In one embodiment, the first projection 314 can be opposite the second projection 316. The projected square 306 can be designated into four quadrants I, II, III, and IV. The first quadrant I can be opposite the IV quadrant, the second quadrant II can be opposite the III quadrant, and the IV quadrant can abut the third quadrant III and the second quadrant II. In one embodiment, the first projection 314 can be in the second quadrant II and the second projection 316 can be in the third quadrant III. In another embodiment, the first projection 314 can be in the second quadrant II and the second projection 314 can be in the fourth quadrant IV. In yet another embodiment, the first projection 314 can be in the second quadrant II and the second projection 316 can be in the first quadrant I. In yet another embodiment, the first projection 314 can be in any of the four quadrants I, II, III, IV and the second projection 316 can be in any of the four quadrants I, II, III, IV not occupied by the first projection 314.

The superstrate 300 within the projected square 306 can produce an open area 310 between an exterior edge 312 of the body 320 and the projected square 306. In one embodiment, the open area 310 is about the area of the projected square 306 minus the area of the body 320 of the superstrate 300. In one embodiment, the first projection 314 can occupy less than or equal to one-fourth the open area 310 and the second projection 316 can occupy less than or equal to one-fourth the open area 310 not occupied by the first projection 314. In one embodiment, the first projection 314 and the second projection 316 can extend from the outer edge 312 of the body 320. In one embodiment, the first projection 314 and the second projection 316 can be machined as one continuous piece with the body 320. In another embodiment, the first projection 314 and the second projection 316 can be separate pieces that are attached to the body 320. The first projection 314 can have a length Y that can be less than or equal to $r\sqrt{2}-r$, where r is a radius of the body 320. In one embodiment, the length Y can be measured from the exterior edge 312 of the body 320 to the outermost edge of the first projection 314. The second projection 316 can have a length Z that can be less than or equal to $r\sqrt{2}-r$, where r is the radius of the body 320. In one embodiment, the length Z can be measured from the exterior edge 312 of the body 320 to the outermost edge of the first projection 316. In one embodiment, Y=Z. In another embodiment Y can be different than Z. For example, Y can be greater than Z. In another embodiment, Y can be less than Z.

Figure 4:
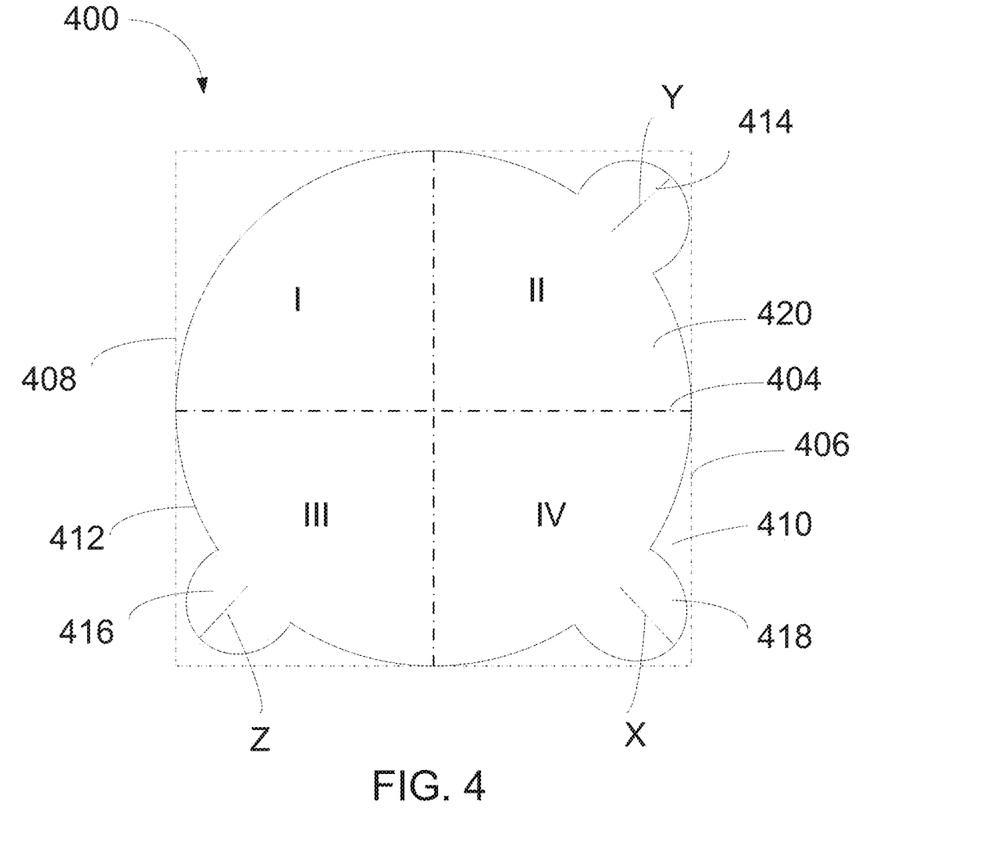
FIG. 4 includes an illustration of a top view of a device superstrate in accordance with an embodiment described herein.

FIG. 4 includes an illustration of a top view of a device superstrate 400 in accordance with an embodiment described herein. The superstrate 400 can be similar to the superstrate 18 of FIG. 1. The superstrate 400 can include a body 420 with a first projection 414, a second projection 416, and a third projection 418. The superstrate 400 can fit within a projected square 406 having sides 408. In one embodiment, a length of each side 408 of the projected square 406 can be equal to a diameter 404 of the body 420 of the superstrate 400. The first projection 414 can be similar to the first projection 314 and the second projection 416 can be similar to the second projection 314. The third projection 418 can have a length X that can be less than or equal to $r\sqrt{2}-r$, where r is a radius of the body 420. In one embodiment, Y=X=Z. In another embodiment, X can be different from Y. In yet another embodiment, X can be different from Z. The third projection 418 can have a similar shape as the first projection 414. In another embodiment, the third projection 418 can have a different shape from the first projection 414. In yet another embodiment, the first projection 414, the second projection 416, and the third projection 418 can all have the same shape. In yet another embodiment, the first projection 414, the second projection 416, and the third projection 418 can each have different geometric shapes. In one embodiment, the third projection 418 can occupy less than or equal to one-fourth the open area 410 not occupied by the first projection 414 or the second projection 416.

Figure 5:
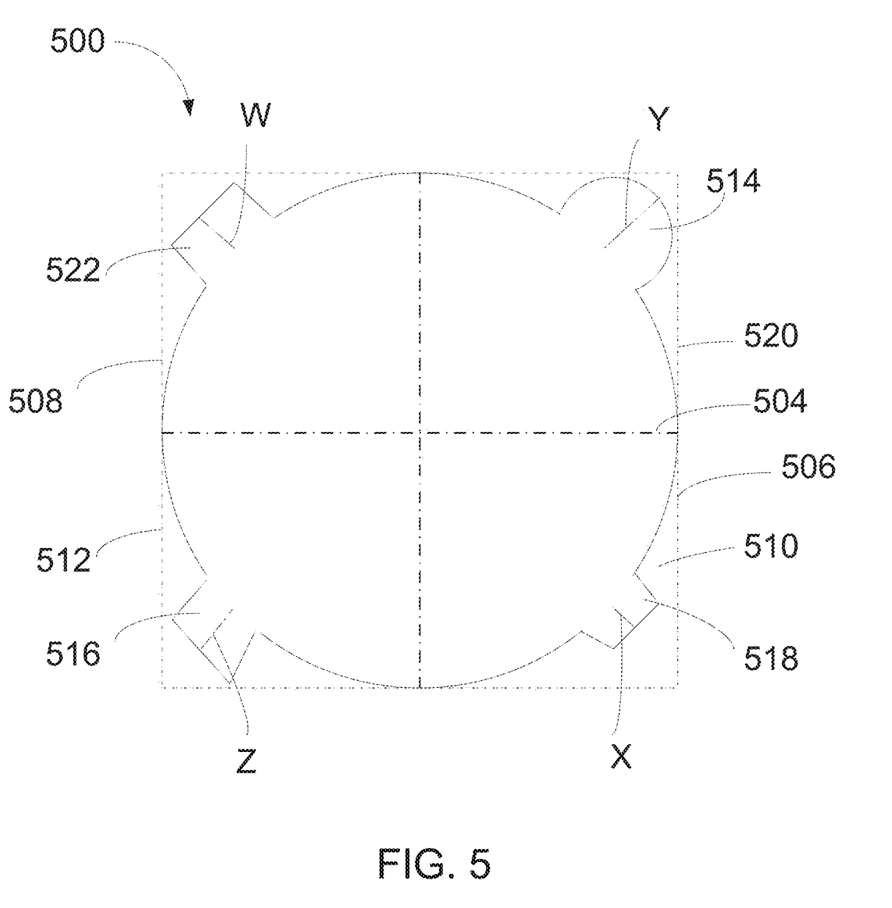
FIG. 5 includes an illustration of a top view of a device superstrate in accordance with an embodiment described herein.

FIG. 5 includes an illustration of a top view of a device superstrate 500 in accordance with an embodiment described herein. The superstrate 500 can be similar to the superstrate 18 of FIG. 1. The superstrate 500 can include a body 520 with a first projection 514, a second projection 516, a third projection 518, and a fourth projection 522. The superstrate 500 can fit within a projected square 506 having sides 508. In one embodiment, a length of each side 508 of the projected square 506 can be equal to a diameter 504 of the body 520 of the superstrate 500. In one embodiment, the first projection 514 can be similar to the first projection 414, the second projection 516 can be similar to the second projection 414, and the third projection 518 can be similar to the third projection 418. In another embodiment, the first projection 514, the second projection 516, and the third projection 518 can each have different geometric shapes. The fourth projection 522 can have a length W that can be less than or equal to $r\sqrt{2}-r$, where r is a radius of the body 520. In one embodiment, Y=X=Z=W. In another embodiment, W can be different from Y. In yet another embodiment, W can be different from Z. In yet another embodiment, W can be different from X. The fourth projection 522 can have a similar shape as the first projection 514. In another embodiment, the fourth projection 522 can have a different shape from the first projection 514. In yet another embodiment, the first projection 514, the second projection 516, the third projection 518, and the fourth projection 522 can all have the same shape. In yet another embodiment, the first projection 514, the second projection 516, the third projection 518, and the fourth projection 522 can each have different geometric shapes. In one embodiment, the fourth projection 522 can occupy less than or equal to one-fourth the open area 510 not occupied by the first projection 514 or the second projection 516 or the third projection 518.

Figure 6:
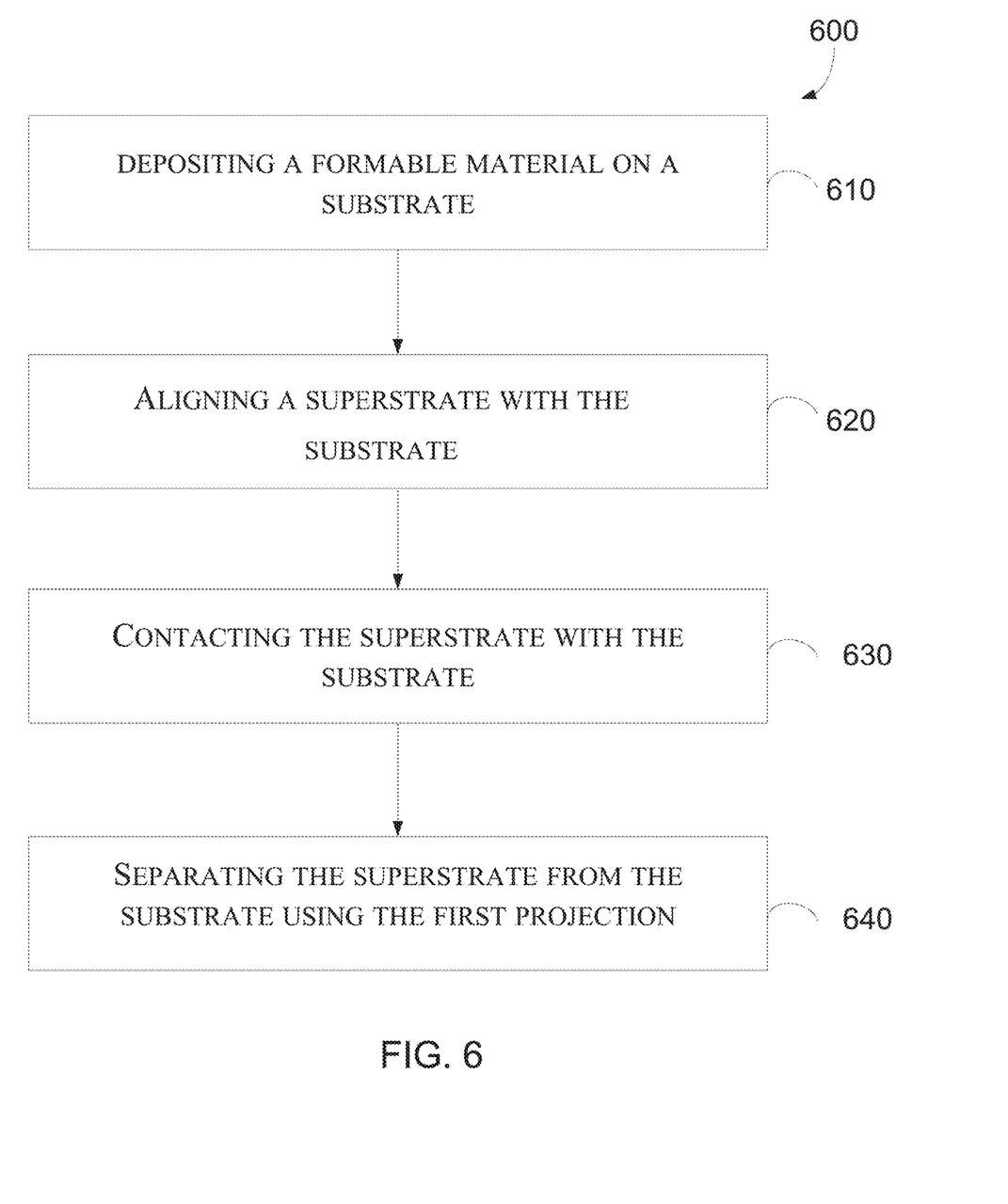
FIG. 6 includes an illustration of a method of the present disclosure.

FIG. 6 includes an illustration of a method 600 of the present disclosure. The method 600 can be performed in the apparatus 10. At operation 610, the formable material 34 can be deposited on the substrate 12. The formable material 34 can be deposited using the fluid dispense system 32. At operation 620, the superstrate 18 can be aligned with the substrate 12. The superstrate 18 can be aligned using an alignment marker. In one embodiment, the projections described above can be used as the alignment marker. The superstrate 18 is aligned with the substrate 12 such that the central axis of the superstrate 18 can be about the same as the central axis of the substrate 12. At operation 630, the superstrate 18 can contact the formable material 34 on the substrate 12. The imprint head 26 can lower the superstrate 18 towards the substrate 12 until the superstrate 18 contacts the formable material 34 deposited on the substrate 12. The superstrate 18 can spread and fill the space between the superstrate 18 and the substrate 12 with formable material 34. The formable material 34 may be cured (e.g., photocuring or thermally) to form a planarization layer. After the planarization layer is formed, the superstrate 18 may be separated from the substrate 12 using the projection, at operation 640. In one embodiment, the superstrate can include a first projection 214, a second projection 316, a third projection 418, and a fourth projection 522. In another embodiment, the superstrate can include between one and four projections. In one embodiment, two projections can be used to enhance crack propagations between the superstrate 18 and the substrate 12. The projection 214 can have extends beyond the outer edge of the substrate 12 and superstrate 18. As such, an applied force, either mechanical, vacuum, or fluid pressure, can be applied to the projection 214 to initiate separation between the superstrate 18 and the substrate 12. In one embodiment, a piezo actuator can be used to contact and push on the projection 214 to enhance peeling or crack propagation between the superstrate 18 and substrate 12. In another embodiment, fluid pressure can be used to push up on the projection 214 and initiate crack propagation. In yet another embodiment, an actuator can lift or pull on the superstrate 18 by applying force on the projection 214.

By placing the at least one projection 214 within the open area 210, the superstrate 18 can be carried in a standard sized front opening unified pod (FOUP). The at least one projection 214 can fit within the open area between the superstrate 18 and the FOUP. In one embodiment, the at least one projection 214 can enhance crack propagation during processing while fitting within a FOUP during manufacturing and transportation. The superstrate 18 can fit within the manufacturing carriers without modification or specific alterations thereby saving manufacturing costs related to equipment designed specifically for superstrates that can be used to initiate separation with the substrate during whole substrate processing. Once separation has occurred, the substrate 12 can undergo further processing and an article can be manufactured from the processed substrate 12.

In one embodiment a method of manufacturing an article can include depositing a formable material 34 on a substrate 12 and contacting a superstrate 18 with the formable material 34 on the substrate 12. In one embodiment, the superstrate can include a body having a diameter. The body can fit within a projected square. In one embodiment, the projected square can have a length equal to the diameter of the body and a first projection can extend from the body within the projected square. The method of manufacturing an article can further include curing the formable material 34 to form a planar layer, separating the superstrate 18 and the formable material 34 on the substrate 12, processing the substrate 12 on which the planar layer has been formed, and manufacturing the article from the processed substrate 12.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A superstrate comprising:
    a body having a diameter, wherein the body fits within a projected square, wherein the projected square has a length equal to the diameter of the body; and
    a first projection extending from the body within the projected square.

2. The superstrate of claim 1, wherein a length of the first projection from the body is greater than zero and is less than or equal to $r\sqrt{2}-r$, where r is a radius of the body.

3. The superstrate of claim 1, wherein the first projection is a circle.

4. The superstrate of claim 1, wherein the first projection exists in one of four areas between the projected square and the body.

5. The superstrate of claim 4, wherein the first projection occupies less than or equal to $\frac{1}{4}^{th}$ the area of the projected square minus the area of the body.

6. The superstrate of claim 1, further comprising a second projection in one of four areas between the projected square and the body, wherein the second projection is in an area not occupied by the first projection.

7. The superstrate of claim 6, wherein a length of the second projection from the body is greater than zero and is less than or equal to $r\sqrt{2}-r$, where r is a radius of the body.

8. The superstrate of claim 6, further comprising:
a third projection in one of four areas between the projected square and the body, wherein the third projection is in an area not occupied by either the first projection or second projection.

9. The superstrate of claim 8, further comprising:
a fourth projection in one of four areas between the projected square and the body, wherein the fourth projection is in an area not occupied by any of the first projection, second projection, or third projection.

10. The superstrate of claim 8, wherein a length of the third projection from the body is greater than zero and is less than or equal to $r\sqrt{2}-r$, where r is the radius of the body.

11. The superstrate of claim 9, wherein a length of the fourth projection from the body is greater than zero and is less than or equal to $r\sqrt{2}-r$, where r is the radius of the body.

12. The superstrate of claim 1, further comprising a mesa.

13. The superstrate of claim 6, wherein the first projection is opposite the second projection from the center of the body.

14. The superstrate of claim 1, wherein the first projection has multiple waves or curves.

15. A method of forming a planarization layer, comprising:
depositing a formable material on a substrate;
contacting a superstrate with the formable material on the substrate; and
separating the superstrate and the formable material on the substrate,
the superstrate comprising:
a body having a diameter, wherein the body fits within a projected square, wherein the projected square has a length equal to the diameter of the body; and
a first projection extending from the body within the projected square.

16. The method of claim 15, wherein separating the superstrate and the substrate is by applying a force on the first projection.

17. The method of claim 15, wherein a length of the first projection from the body is greater than zero and is less than or equal to $r\sqrt{2}-r$, where r is the radius of the body.

18. A method of manufacturing an article, comprising:
depositing a formable material on a substrate;
contacting a superstrate with the formable material on the substrate, the superstrate comprising:
a body having a diameter, wherein the body fits within a projected square, wherein the projected square has a length equal to the diameter of the body; and
a first projection extending from the body within the projected square;
curing the formable material to form a planar layer;
separating the superstrate and the formable material on the substrate;
processing the substrate on which the planar layer has been formed; and
manufacturing the article from the processed substrate.

19. The method of manufacturing an article of claim 18, wherein separating the superstrate and the substrate is by applying a force on the first projection.

20. The method of manufacturing an article of claim 18, wherein the superstrate further comprises a second projection extending from the body, and wherein separating the superstrate and the formable material on the substrate is by applying force on the second projection.

* * * * *